US006638793B1

(12) United States Patent
Chen

(10) Patent No.: US 6,638,793 B1
(45) Date of Patent: Oct. 28, 2003

(54) METHODOLOGY TO PACK STANDARD STAGGERED BOND INPUT-OUTPUT BUFFER INTO LINEAR INPUT-OUTPUT BUFFER

(75) Inventor: Chung-Hui Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 57 days.

(21) Appl. No.: 10/086,260

(22) Filed: Mar. 4, 2002

(51) Int. Cl.$^7$ ............................................. H01L 21/44
(52) U.S. Cl. ................. 438/123; 438/617; 438/106; 438/14; 438/129; 438/612; 257/786; 257/203; 257/210; 257/784
(58) Field of Search .................. 438/123, 617, 438/106, 14, 129, 612; 257/786, 203, 210, 784

(56) References Cited

U.S. PATENT DOCUMENTS

| 5,220,210 A | * | 6/1993 | Miwada | 257/443 |
|---|---|---|---|---|
| 5,381,307 A | * | 1/1995 | Hertz et al. | 361/767 |
| 5,567,655 A | * | 10/1996 | Rostoker et al. | 438/123 |
| 5,641,978 A | | 6/1997 | Jassowski | 257/203 |
| 5,675,179 A | * | 10/1997 | Shu et al. | 257/668 |
| 5,818,114 A | | 10/1998 | Pendse et al. | 257/786 |
| 6,008,532 A | * | 12/1999 | Carichner | 257/691 |
| 6,057,169 A | | 5/2000 | Singh et al. | 438/14 |
| 6,078,505 A | * | 6/2000 | Turudic | 361/760 |
| 6,214,638 B1 | | 4/2001 | Banerjee | 438/106 |
| 6,222,213 B1 | | 4/2001 | Fujiwara | 257/210 |
| 6,251,768 B1 | * | 6/2001 | Lin | 438/617 |

FOREIGN PATENT DOCUMENTS

JP          06204653 A   *  6/1994   ........... H01K/3/34

* cited by examiner

Primary Examiner—Matthew Smith
Assistant Examiner—V. Yevsikov
(74) Attorney, Agent, or Firm—George O. Saile; Stephen B. Ackerman

(57) ABSTRACT

A new method is provided that allows placing or stacking staggered bond I/O buffers into linear bond I/O buffers. The bond pads are linearly arranged, the interface between the staggered bond pad I/O buffers and the linearly arranged bond pads is achieved by a frame design that sequentially connects the staggered bond pad I/O buffers to the linearly arranged bond pads.

14 Claims, 5 Drawing Sheets

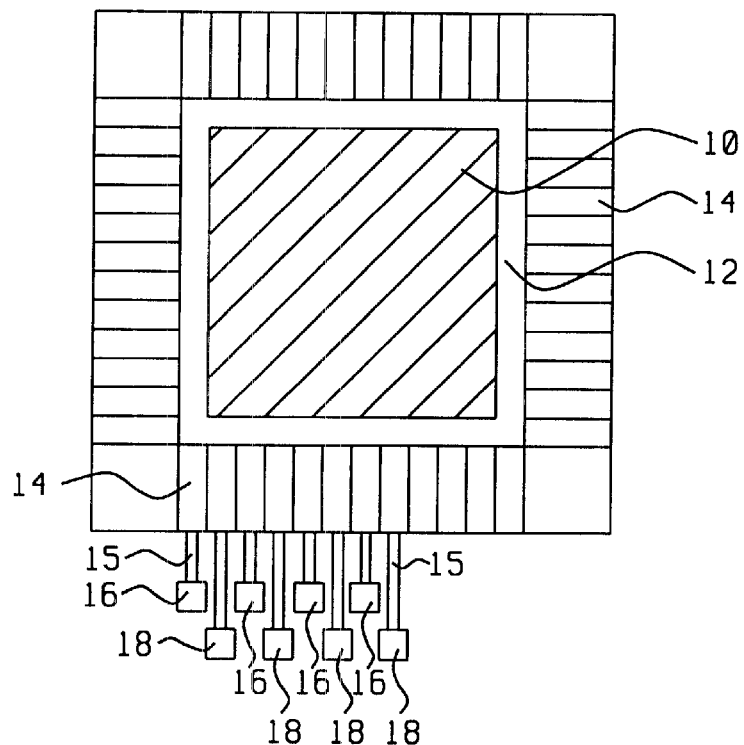
*FIG. 1a – Prior Art*
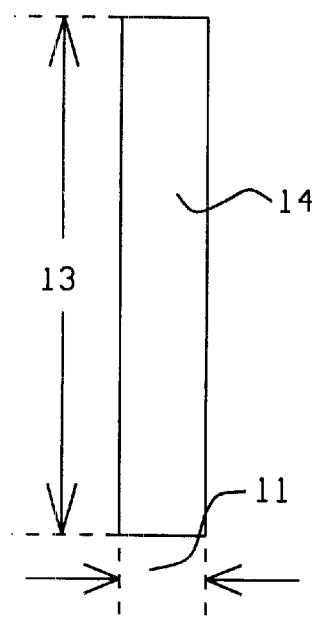
*FIG. 1b – Prior Art*

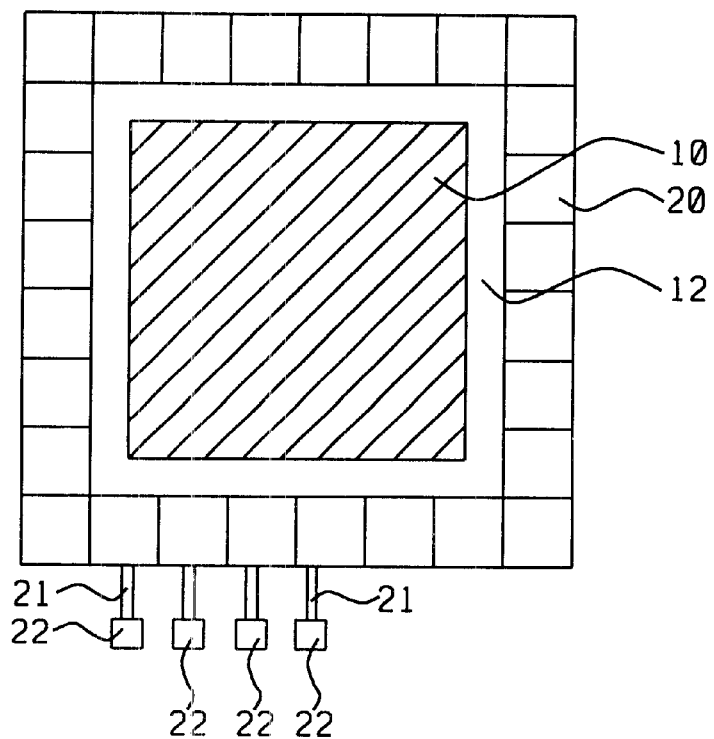
FIG. 2a – Prior Art
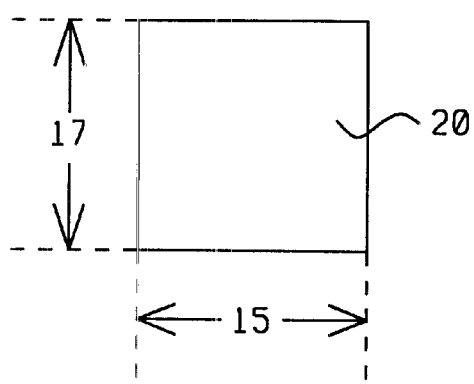
FIG. 2b – Prior Art

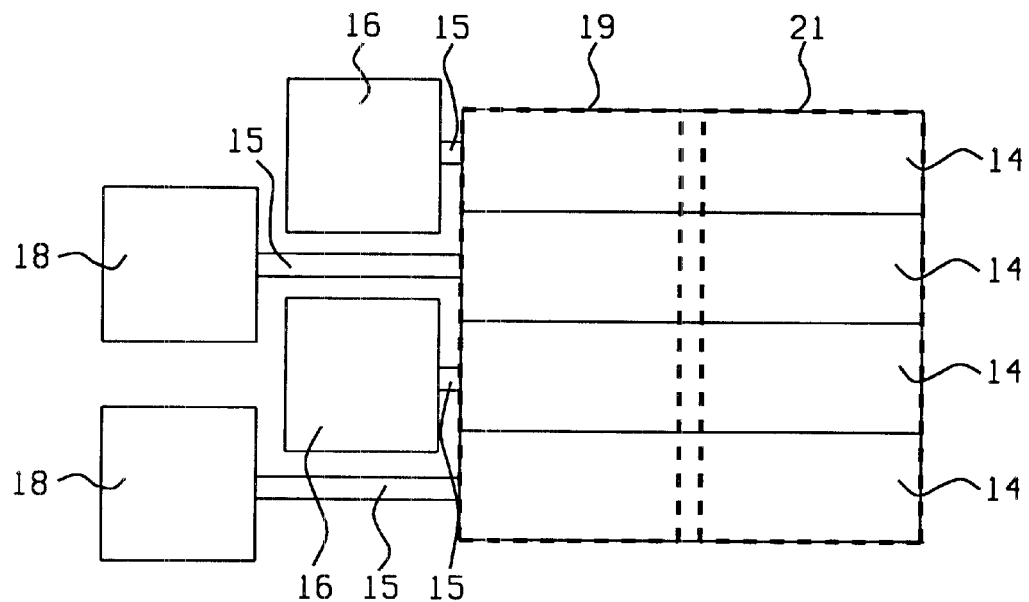
FIG. 3 - Prior Art
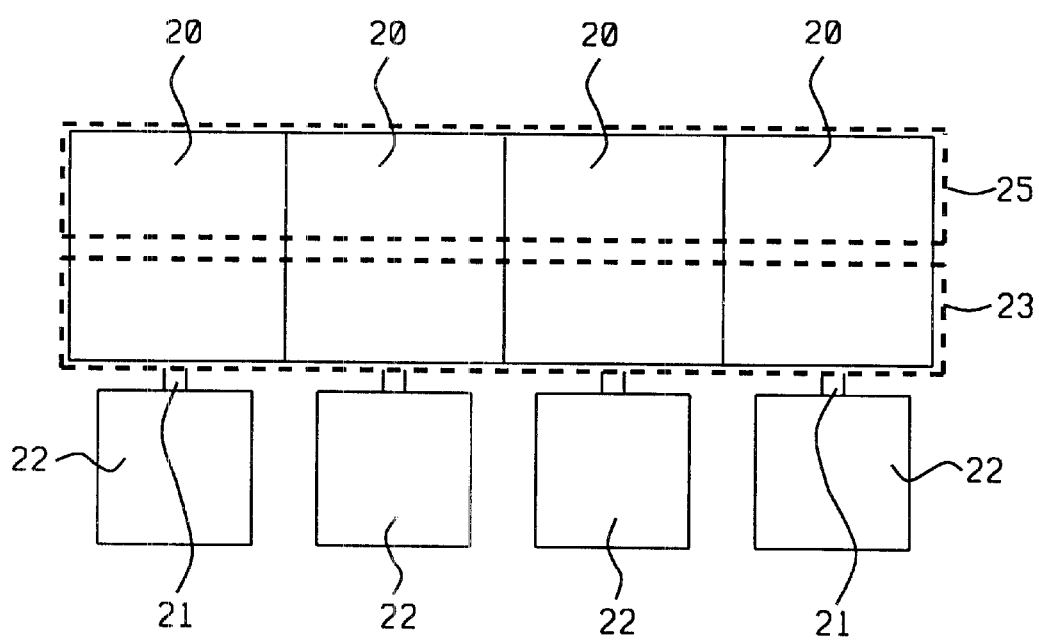
FIG. 4 - Prior Art

US 6,638,793 B1

METHODOLOGY TO PACK STANDARD STAGGERED BOND INPUT-OUTPUT BUFFER INTO LINEAR INPUT-OUTPUT BUFFER

BACKGROUND OF THE INVENTION (1) Field of the Invention

The invention relates to the fabrication of integrated circuit devices, and more particularly, to a method for arranging staggered bond I/O buffers as linear bond I/O buffers.

(2) Description of the Prior Art

Semiconductor Integrated Circuit (IC) chips or die contain multiple co-functional components that together constitute a complex and extremely densely packed arrangement of electrical components. The layout of the semniconductor die is typically divided into separate functional areas of which the logic functions are one of the major functions on the surface of the IC. With the increased complexity of IC devices, logic functions are contained within complete functional blocks such as a Central Processing Unit (CPU), further supported by a Read Only Memory (ROM) block, clock and timing units, Random Access Memory (RAM) functions and Input/Output (I/O) units. The I/O units can for instance provide an electrical interface between the CPU unit and peripheral devices that are functionally connected to the CPU. The overall layout of the semiconductor die is divided in the highlighted function in order to enable and facilitate the design of the surface area of the substrate on the surface of which these components are created. The logic functions on the surface of the substrate may contain numerous individual logic elements such as gate electrodes or combinations of logic cells to perform specific logic functions.

The completed IC must, with the above highlighted supporting functions such as RAM and ROM functions, be further connected to surrounding circuitry. This interconnection is typically achieved by wire-bonding the IC whereby internal IC functions or functional blocks are connected to at least one bond pad which is used as an electrical interface for I/O signals. The IC is mounted in a plastic or ceramic based package for macro-level interconnection of the IC, the package is provided with I/O pins or contact balls, which are connected to the I/O bond pads of the IC. The I/O pins of the package make contact with higher level device support surfaces such as the surface of a Printed circuit Board (PCB), which in turn may be provided with at least one layer of interconnect traces for purposes of establishing an electrically conductive interconnect network.

Power, such as VDD and VSS voltages, is connected to the IC by means of the bond pads whereby each of these bond pads is connected to a power I/O cell, which in turn is connected to power rings or leads on the surface of the substrate. The power rings supply individual units on the surface of the substrate with the required level of voltage such as VDD or VSS. Power rings are for instance used to supply power to I/O circuitry or to internal logic circuitry. The same functional units can in this manner be provided with ground connections.

It will be appreciated, due to the extreme density and the extreme complexity of the circuitry and functional components that are provided as part of an IC, that connections of power and ground and signal constitute an important aspect of the overall design and layout of the IC. This design is, as always, under severe restrictions of surface area that is required for these interconnections while it is to be expected that various methods, such as staggered I/O connections and linear I/O connections, are applied in order to meet various requirements of design. The invention addresses issues of I/O design. A method is provided whereby staggered I/O connections are converted into linear bond I/O connections, meeting requirements of I/O interconnect of the IC while at the same time reducing the surface area that is required for the needed I/O interconnects.

U.S. Pat. No. 6,214,638 (Banerjee) shows a bond pad layout with staggered positioning.

U.S. Pat. No. 6,057,169 (Singh et al.) reveals a bond pad I/O layout.

U.S. Pat. No. 5,818,114 (Pendse et al.) shows a radially staggered BP layout.

U.S. Pat. No. 5,641,978 (Jassowski) and U.S. Pat. No. 6,222,213 (Fujiwara) are related patents.

SUMMARY OF THE INVENTION

A principle objective of the invention is to pack a staggered bond pad I/O layout into a linear bond pad I/O layout.

Another objective of the invention is to enable the re-use of circuits and layout of an Integrated Circuit without being affected by bond pad layout.

Yet another objective of the invention is to pack a staggered bond pad I/O layout into a linear bond pad I/O layout without having a negative impact on device performance.

A still further objective of the invention is to provide a method of I/O interconnects that does not require I/O re-design when going from one technology to another technology, making I/O interconnect layout interchangeable between different technologies.

In accordance with the objectives of the invention a new method is provided that allows placing or stacking staggered bond I/O buffers into linear bond I/O buffers. The bond pads are linearly arranged, the interface between the staggered bond pad I/O buffers and the linearly arranged bond pads is achieved by a frame design that sequentially connects the staggered bond pad I/O buffers to the linearly arranged bond pads.

BRIEF DESCRIPTION OF THE DRAWINGS

FIGS. 1a and 1b show a top view of a prior art staggered bond cell I/O arrangement.

FIGS. 2a and 2b show a top view of a prior art linear bond cell I/O arrangement.

FIG. 3 shows a detailed top view of a prior art staggered bond cell I/O arrangement.

FIG. 4 shows a detailed top view of a prior art linear bond cell I/O arrangement.

DESCRIPTION OF THE PREFERRED EMBODIMENTS

Figure 5:
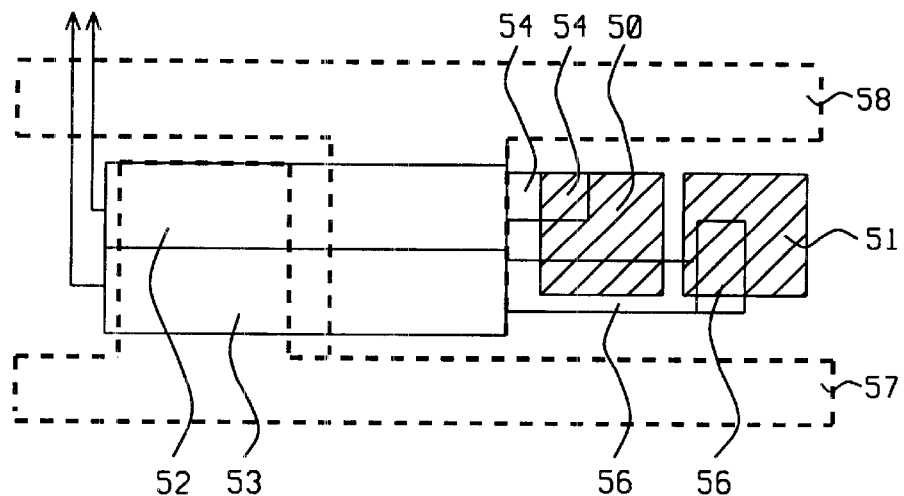
FIG. 5 shows a top view of a 2-set staggered bond cell arrangement of the invention whereby the staggered bond I/O buffers are connected to linearly arranged bond pads.

In order to have a better understanding of the invention, it is of importance to first have an understanding of current practices. The current practices have been highlighted in and will be explained using FIGS. 1a through 4.

First addressed will be the top view of a staggered I/O pad design that is shown in FIGS. 1a and 1b.

Specifically referring to FIG. 1a, there is shown in top view:

10, the surface area of a substrate over which the basic or core logic devices have been created; the invention provides for addressing by means of I/O interconnects these core logic devices 12, a surface area of separation between the core logic devices and surrounding I/O elements of the IC; this area has no significance to the invention; interconnect traces which are provided for the operational capabilities, especially and germane to the invention, have for reasons of simplicity not been shown in FIG. 1a 14, staggered bond pad I/O buffers arranged around the perimeter and surrounding the core logic devices 10

15, an interface between I/O bond pads 16/18 and staggered bond pad I/O buffers 14

16 and 18, bond pads that connect to the staggered bond pad I/O buffers 14.

FIG. 1b shows a top view of one staggered bond pad I/O buffer 14, with elements:

11, the width of a staggered bond pad I/O buffer 14

13, the height of a staggered bond pad I/O buffer 14.

It is clear from the top view that the bond pads 16 and 18 have been arranged in a staggered manner whereby bond pads 16 are more closely located to the staggered bond pad I/O buffers 14 than are bond pads 18. From this method of placing the bond pads the term of staggered bond pads is derived. It is further clear from the top view that is shown in FIG. 1a that the staggered bond pad I/O buffers 14 are narrow in width (parameter 11, FIG. 1b) and relatively long (parameter 13, FIG. 1b). This in order to accommodate the I/O pads 16/18 while still keeping the required surface are for the core logic devices 10 as small as possible.

Referring now to the top view that is shown in FIG. 2a, there is shown a linear bond pad arrangement, comprising the following new elements that have not previously been discussed:

20, a linear bond pad I/O buffer

22, I/O bond pads.

The design that is shown in top view of FIG. 2a is used for designs where the surface area that is taken up by the core logic devices is relatively large while the number of I/O connections that are required for the core logic devices is relatively small. The linear bond pad I/O buffer 20 is therefore made relatively wide (parameter 15, FIG. 2b) and not as long (parameter 17, FIG. 2b) as the I/O buffer that is used for the staggered bond pad I/O buffer. This is shown in the top view of one linear bond pad I/O buffer 20 that is shown in FIG. 2b. Dimension 11, FIG. 1b, is smaller than dimension 15, FIG. 2b, while dimension 13, FIG. 1b, is larger than dimension 17, FIG. 2b.

From the above it may be concluded that all elements of design that refer to FIGS. 1a and 1b can be referred to with the prefix of "staggered" while all elements of design that refer to FIGS. 2a and 2b can be referred to with the prefix of "linear".

FIG. 3 shows a detailed top view of a staggered bond pad arrangement that corresponds to the staggered bond pad arrangement of FIG. 1. Added to the top view that is shown in FIG. 3 are power rail 19 that is used to supply VSS power to the I/O buffers 14 and power rail 21 that is used to supply VDD power to the I/O buffers 14. It is clear that this selection of VSS and VDD as related to power busses 19 and 21 is arbitrary and can therefore be reversed. All other elements that are shown in FIG. 3 have previously been highlighted under FIG. 1 and are therefore not highlighted at this time.

FIG. 4 shows a detailed top view of a linear bond pad arrangement that corresponds to the linear bond pad arrangement of FIG. 2. Added to the top view that is shown in FIG. 4 are power rail 23 that is used to supply VSS power to the I/O buffers 20 and power rail 25 that is used to supply VDD power to the I/O buffers 20. It is clear that this selection of VSS and VDD as related to power basses 23 and 25 is arbitrary and can therefore be reversed. All other elements that are shown in FIG. 4 have previously been highlighted under FIG. 2 and are therefore not highlighted at this time.

From the above highlighted designs of FIGS. 1a through FIG. 4 it is clear that there is a significant difference in design and layout between the staggered bond pad I/O buffers and the linear bond pad I/O buffers and the thereby belonging I/O bond pads. This difference leads to additional cost of design and implementation when it is required to switch from one design to another or when designs are to be used interchangeably. It is therefore of advantage to provide one design that can replace the staggered and a linear mode of prior art so that no re-design is required in going from one technology to another technology. The invention provides such a design, as highlighted in FIGS. 5 through 7. It must thereby kept in mind that the invention provides a method to connect staggered bond pad I/O buffers to linearly arrange bond pads. The linear bond pad I/O buffers continue to be connected to the bond pads as before, that is as shown in for instance FIG. 4.

FIG. 5 shows a top view of a two-set (having two bond pads) design of the invention. Specifically shown in the top view of FIG. 5 are:

50 and 51, bond pads for I/O interconnect 52 and 53, two original staggered bond pad I/O buffers 54, lower level metal to connect staggered bond pad I/O buffer 52 to bond pad 50

56, lower level metal to connect staggered bond pad I/O buffer 53 to bond pad 51

57 a first power rail to connect VSS (or VDD) power to the staggered bond pad I/O buffers 52 and 53.

58 a second power rail to connect VDD (or VSS) power to the staggered bond pad I/O buffers 52 and 53.

Bond pads 50 and 51 are typically provided on a IC support surface such as the surface of semiconductor substrates, printed circuit boards, flex circuits, metallized substrates, glass substrates and semiconductor device mounting supports, ceramic substrates, gallium arsenide substrates, silicon substrates comprising a single layer of material, such as a silicon wafer or comprising silicon on insulator (SOI) technology and silicon on sapphire (SOS) technology, doped and undoped semiconductors, epitaxial layers of silicon supported by a base semiconductor and substrates used for flat panel displays.

The design that is shown in top view in FIG. 5 shows that the bond pads linearly protrude from the staggered bond pad I/O buffers. For the two-set bond pad design that is shown in FIG. 2, it would be possible and feasible to continue using the conventional design since the stack of bond pads, comprising only two bond pads, is not very long. The design of the invention will be more advantageously used for a larger number of bond pads as will be clear from the following two figures.

Figure 6:
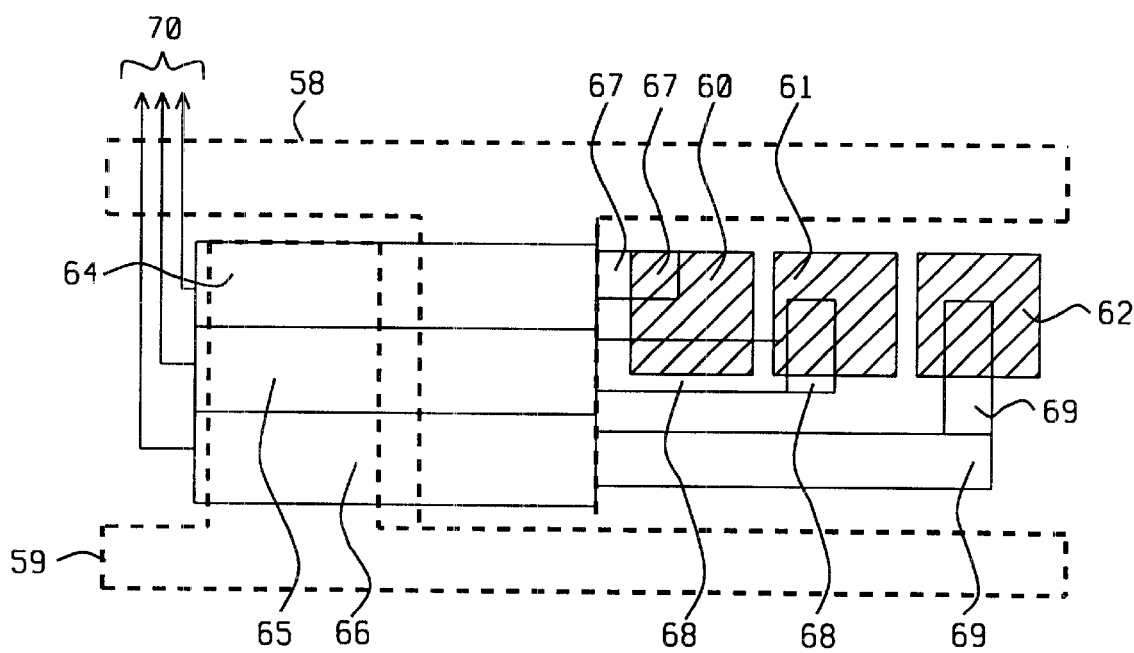
FIG. 6 shows a top view of a 3-set staggered bond cell arrangement of the invention whereby the staggered bond I/O buffers are connected to linearly arranged bond pads.

FIG. 6 shows a top view of a three-set arrangement, specifically highlighted in FIG. 6 are:

- 60, 61 and 62, three bond pads that constitute the three-set bond pad arrangement
- 64, an original first staggered bond pad I/O buffer
- 65, an original second staggered bond pad I/O buffer
- 66, an original third staggered bond pad I/O buffer
- 67, lower level metal to interconnect the first staggered bond pad I/O buffer 64 with bond pad 60
- 68, lower level metal to interconnect the second staggered bond pad I/O buffer 65 with bond pad 61
- 69, lower level metal to interconnect the third staggered bond pad I/O buffer 66 with bond pad 62
- 58, a first power rail to connect VSS (or VDD) power to the staggered bond pad I/O buffers 64, 65 and 66
- 59, a second power rail to connect VDD (or VSS) power to the staggered bond pad I/O buffers 64, 65 and 66
- 70, signal interconnect lines that respectively interconnect the first, the second and the third staggered bond pad I/O buffers 64, 65 and 66 to supporting circuitry.

It must be observed with respect to the top view that is shown in FIG. 6 that the power rails 58 and 59 can be implemented over the staggered bond pad I/O buffers 64, 65 and 66 by using higher level metal or by using the same level metal that is used by the staggered bond pad I/O buffers 64, 65 and 66. The three set staggered-to-linear conversion arrangement can convert any three staggered bond pad I/O buffers to a linearly arranged three bond pads. It must further be pointed out that the three set arrangement that is shown in FIG. 3 can readily be applied to a two set arrangement (FIG. 5) or can be extended to a four set arrangement that is shown in FIG. 7.

Figure 7:
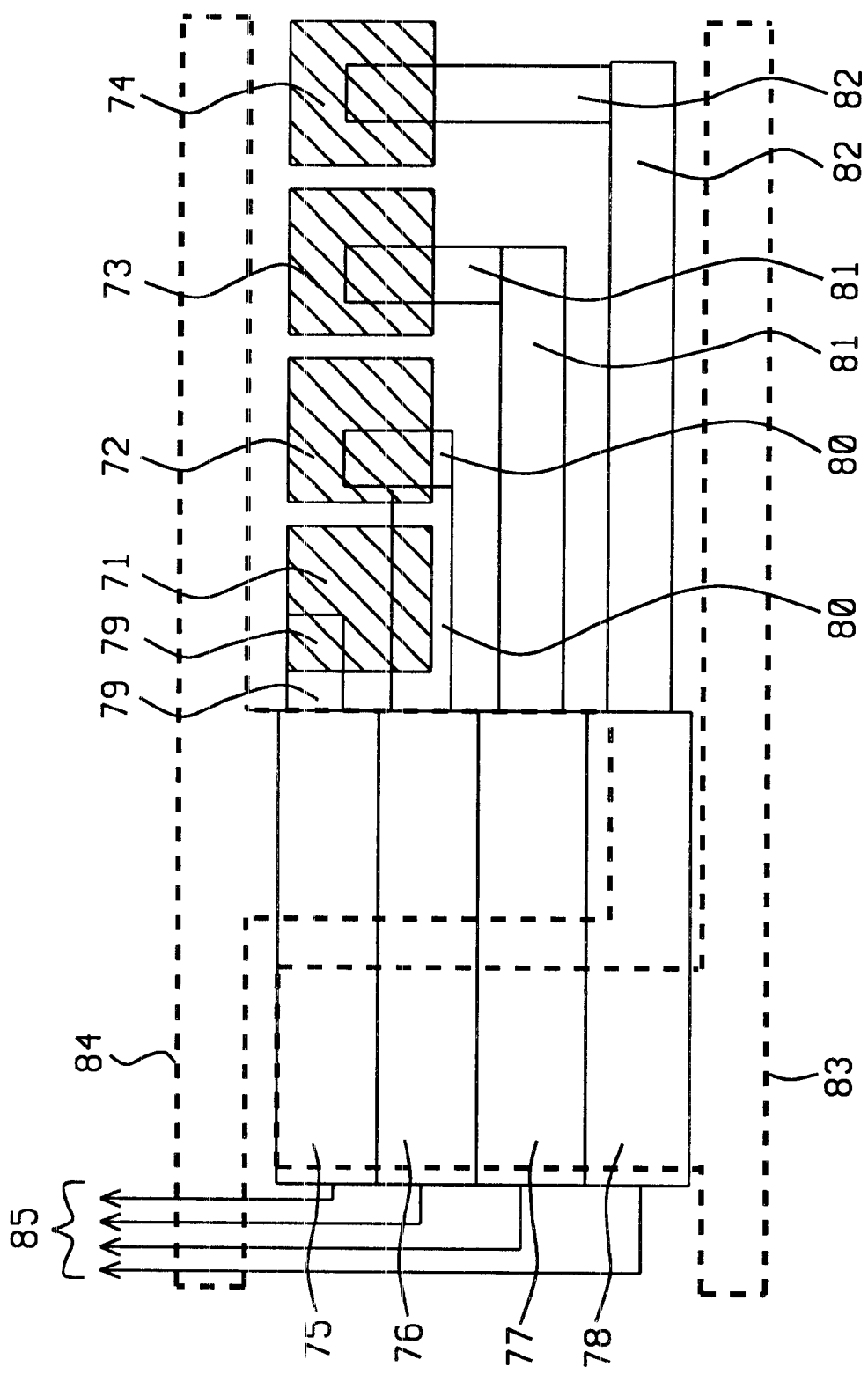
FIG. 7 shows a top view of a 4-set staggered bond cell arrangement of the invention whereby the staggered bond I/O buffers are connected to linearly arranged bond pads.

FIG. 7 shows a top view of the now familiar features of the invention whereby these features have been extended to a four-set arrangement. Shown in FIG. 7 are:

- 71, 72, 73 and 74, four bond pads that constitute the four-set bond pad arrangement
- 75, an original first staggered bond pad I/O buffer
- 76, an original second staggered bond pad I/O buffer
- 77, an original third staggered bond pad I/O buffer
- 78, an original fourth staggered bond pad I/O buffer
- 79, lower level metal to interconnect the first staggered bond pad I/O buffer 75 with bond pad 71
- 80, lower level metal to interconnect the second staggered bond pad I/O buffer 76 with bond pad 72
- 81, lower level metal to interconnect the third staggered bond pad I/O buffer 77 with bond pad 73
- 82, lower level metal to interconnect the third staggered bond pad I/O buffer 78 with bond pad 74
- 83, a first power rail to connect VSS (or VDD) power to the staggered bond pad I/O buffers 75, 76, 77 and 78
- 59, a second power rail to connect VDD (or VSS) power to the staggered bond pad I/O buffers 75, 76, 77 and 78
- 85, signal interconnect lines that respectively interconnect the first, the second, the third and the fourth staggered bond pad I/O buffers to 75, 76, 77 and 78 supporting circuitry.

The stack of bond pads 71, 72, 73 and 74 is relatively high, requiring a relatively advanced staggered bond pad I/O buffer arrangement. The principle of the invention however remains the same as has been shown for the two-set-land the three-set designs.

The following observation must be made with respect to the top views that have been shown in FIGS. 5 through 7. It is clear from these top view that only the staggered bond I/O buffer arrangement has been addressed in these top vies, the reason for this is, as has previously been pointed out, that the staggered bond I/O buffers are long and narrow and are therefore closely spaced together, specifically where this relates to creating interfaces to bond pads. The new, linear spacing of the bond pads as these bond pads are created for staggered bond pad I/O buffers (FIGS. 5 through 7) allows the bond pads to be spaced as has been highlighted for the linear bond pad arrangements (FIGS. 2 and 4) but now these same linearly spaced bond pads can be connected to staggered bond pad I/O buffers. That the same, linearly spaced bond pad arrangement can be used for both the staggered and the linear bond pad I/O buffers is clear from FIGS. 5 through 7 (addressing the staggered bond pad I/O buffer) and by realizing that the bond pad arrangement remains unmodified from a linear bond pad I/O buffer point of view. By for instance taking the top view of FIG. 7, this view shows the arrangement for the staggered bond pad I/O buffers. By leaving the bond pads 79–74 in place as shown in, FIG. 7 and by turning the I/O buffers 75–78 by 90 degrees and positioning the I/O buffers opposite the bond pads, it is realized that now the case of linear bond pad I/O buffers applies. From this it can be concluded that the invention provides for both staggered (narrow and long) and linear (wide and short) bond pad I/O buffers.

The invention can be summarized as follows:

- a substrate is provided, semiconductor devices have been created in or on the surface of the substrate, at least one Integrated Circuit (IC) die has been separated from the substrate, the at least one Integrated Circuit (IC) has been provided with bond pad I/O buffers around the perimeter of the at least one IC die
- an IC support surface is provided for mounting the at least one IC on a surface thereof, bond pads have been provided on the surface of the IC support surface, the bond pads are aligned with the bond pad I/O buffers provided around the perimeter of the at least one IC die
- the bond pad I/O buffers around the perimeter of the at least one IC die are divided into at least one first subset, having a first number of bond pad I/O buffers
- the bond pads having been provided on the surface of the IC support surface are divided into at least one second subset, having a second number of bond pads, the second number of bond pads is equal to the first number of bond pad I/O buffers, the at least one second subset of bond pads is aligned with the at least one first subset of bond pad I/O buffers, the at least one second subset of bond pads is arranged in a sequence that perpendicularly protrudes for the perimeter of the at least one IC die
- a numerical value is assigned to each element of the at least one first subset of bond pads I/O buffers and to each element of the at least one second subset of bond pads by assigning. consecutive numbers starting with a number one to each element of the at least one first subset of bond pads I/O buffers and each element of the at least one second subset of bond pads
- elements of the at least one first subset of bond pads I/O buffers are matched with elements of equal numerical numbers of the at least one second subset of bond pads, creating matched elements
- matched elements of the at least one first subset of bond pad I/O buffers and the at least one second subset of bond pads are interconnected with a conductive material, the conductive material can comprise lower level, higher level, equal level or a combination thereof of the conductive material that is used for the at least one first subset of bond pads I/O buffers and the at least one second subset of bond pads power rails are provided to connect power to the at least one bond pad I/O buffers comprising lower level, higher level, equal level or a combination thereof of the conductive material that is used for the at least one first subset of bond pads I/O buffers and the at least one second subset of bond pads interconnecting the matched elements of the at least one first. subset of bond pads I/O buffers and the at least one second subset of bond pads with a conductive material comprises creating perpendicularly intersecting interconnect metal the bond pad I/O buffers have a width that is smaller than a length of the bond pad I/O buffer by a measurable amount.

From the top views that are shown in FIGS. 5 through 7, it is clear that the invention provides for:

avoiding the difficult and complex requirement of I/O redesign of the layout of the bond pads avoiding the difficult and complex requirement of converting from a set of staggered I/O buffers (which are typically of narrow width and long height) to a set of linear I/O buffers (which are typically of wide width and short height)

an easy layout of a metal frame for the interfacing between the I/O buffers and the bond pads a new design whereby the area that is required for the re-designed interface between the I/Q buffer and the bond pads is not much different from the area that is required by conventional designs for the interface between the I/O buffer and the bond pads.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to connect staggered bond pad Input/Output (I/O) buffers to linearly arranged bond pads, comprising the steps of:

providing a substrate, semiconductor devices having been created in or on the surface of said substrate, at least one Integrated Circuit (IC) die having been separated from said substrate, said at least one Integrated Circuit (IC) having been provided with bond pad I/O buffers around the perimeter of said at least one IC die;

providing an IC support surface for mounting said at least one IC on a surface thereof, bond pads having been provided on the surface of said IC support surface, said bond pads being aligned with said bond pad I/O buffers provided around the perimeter of said at least one IC die;

dividing said bond pad I/O buffers around the perimeter of said at least one IC die into at least one first subset, having a first number of bond pad I/O buffers;

dividing said bond pads having been provided on the surface of said IC support surface into at least one second subset, having a second number of bond pads, said second number of bond pads being equal to said first number of bond pad I/O buffers, said at least one second subset of bond pads being aligned with said at least one first subset of bond pad I/O buffers, said at least one second subset of bond pads being arranged in a sequence that perpendicularly protrudes for said perimeter of said at least one IC die;

assigning numerical values to each element of said at least one first subset of bond pads I/O buffers and to each element of said at least one second subset of bond pads by assigning consecutive numbers starting with a number one to each element of said at least one first subset of bond pads I/O buffers and each element of said at least one second subset of bond pads;

matching elements of said at least one first subset of bond pads I/O buffers with elements of equal numerical numbers of said at least one second subset of bond pads, creating matched elements; and interconnecting said matched elements of said at least one first subset of bond pad I/O buffers and said at least one second subset of bond pads with a conductive material.

2. The method of claim 1, wherein said IC support surface is selected from the group of surfaces consisting of semiconductor substrates, printed circuit boards, flex circuits, metallized substrates, glass substrates and semiconductor device mounting supports, ceramic substrates, gallium arsenide substrates, silicon substrates comprising a single layer of material, such as a silicon wafer or comprising silicon on insulator (SOI) technology and silicon on sapphire (SOS) technology, doped and undoped semiconductors, epitaxial layers of silicon supported by a base semiconductor and substrates used for flat panel displays.

3. The method of claim 1, said interconnecting said matched elements of said at least one first subset of bond pads I/O buffers and said at least one second subset of bond pads with a conductive material comprises interconnecting using lower level metal as is used for said at least one first subset of bond pads I/O buffers and said at least one second subset of bond pads.

4. The method of claim 1, said interconnecting said matched elements of said at least one first subset of bond pads I/O buffers and said at least one second subset of bond pads with a conductive material comprises interconnecting using higher level metal as is used for said at least one first subset of bond pads I/O buffers And said at least one second subset of bond pads.

5. The method of claim 1, said interconnecting said matched elements of said at least one first subset of bond pads I/O buffers and said at least one second subset of bond pads with a conductive material comprises interconnecting using the same level metal as is used for said at least one first subset of bond pads I/O buffers and said at least one second subset of bond pads.

6. The method of claim 1, said interconnecting said matched elements of said at least one first subset of bond pads I/O buffers and said at least one second subset of bond pads with a conductive material comprises interconnecting using lower or higher or the same level metal or a combination thereof as is used for said at least one first subset of bond pads I/O buffers and said at least one second subset of bond pads.

7. The method of claim 1, additionally providing a first power rail and a second power rail to connect power to said at least one bond pad I/O buffers.

8. The method of claim 7, said power comprising VDD and VSS voltages.

9. The method of claim 7, said additionally providing a first power rail and a second power rail comprises interconnecting using lower level metal as is used for said at least one first subset of bond pads I/O buffers and said at least one second subset of bond pads.

10. The method of claim 7, said additionally providing a first power rail and a second power rail comprises interconnecting using higher level metal as is used for said at least one first subset of bond pads I/O buffers and said at least one second subset of bond pads.

11. The method of claim 7, said additionally providing a first power rail and a second power rail comprises interconnecting using the same level metal as is used for said at least one first subset of bond pads I/O buffers and said at least one second subset of bond pads.

12. The method of claim 7, said additionally providing a first power rail and a second power rail comprises interconnecting using lower or higher or the same level metal or a combination thereof as is used for said at least one first subset of bond pads I/O buffers and said at least one second subset of bond pads.

13. The method of claim 1, said interconnecting said matched elements of said at least one first subset of bond pads I/O buffers and said at least one second subset of bond pads with a conductive material comprising providing first interconnect metal that perpendicularly to the perimeter of said at least one IC die protrudes from at least one element of said at least one first subset of bond pads I/O buffers, further providing second interconnect metal at the same level and being connected to the first interconnect metal whereby the second interconnect metal perpendicularly intersects with the first interconnect metal, completing interconnection between elements of equal numerical value of said at least one first subset of bond pads I/O buffers and said at least one second subset of bond pads.

14. The method of claim 1, said bond pad I/O buffers having a width that is smaller than a length of said bond pad I/O buffer by a measurable amount, said width being measured in a direction of a perimeter of said at least one IC die, said length being measured in a direction that is perpendicular to a perimeter of said at least one IC.

* * * * *